United States Patent [19]

Inagaki

[11] Patent Number: 4,810,320

[45] Date of Patent: Mar. 7, 1989

[54] METHOD OF SELECTIVELY FORMING AN ALUMINUM EVAPORATION FACE

[76] Inventor: Hiromichi Inagaki, 1-143 Aza Maedaomote, Inuyama-shi, Aichi-Ken, Japan

[21] Appl. No.: 144,592

[22] Filed: Jan. 7, 1988

Related U.S. Application Data

[63] Continuation of Ser. No. 840,587, Mar. 18, 1986, abandoned.

[51] Int. Cl.$^4$ ............... B44C 1/16; B32B 1/00; B32B 31/00
[52] U.S. Cl. .................... 156/233; 156/234; 156/241; 156/277; 156/344; 427/208.8
[58] Field of Search ............... 156/230, 233, 234, 238, 156/241, 246, 247, 249, 289, 277, 300, 307.3, 311, 331.7, 344; 427/207.1, 208.6, 208.8, 258, 272; 101/211, 426; 29/423, 424; 283/83; 430/126

[56] References Cited

U.S. PATENT DOCUMENTS

| | | | |
|---|---|---|---|
| Re. 29,820 | 10/1978 | Konicek | 156/241 |
| 3,080,270 | 3/1963 | Lorenz | 156/233 |
| 3,088,402 | 5/1963 | Newman | 156/234 |
| 3,480,500 | 11/1969 | Hotter | 156/234 |
| 4,012,552 | 3/1977 | Watts | 156/233 |
| 4,152,476 | 5/1979 | Stillman | 156/233 |
| 4,359,491 | 11/1982 | Lai-Chun | 156/234 |
| 4,382,831 | 5/1983 | Clough et al. | 156/233 |
| 4,388,137 | 6/1983 | McCarty et al. | 156/232 |
| 4,477,312 | 10/1984 | Czichy | 156/233 |
| 4,484,970 | 11/1984 | Burzlaff et al. | 156/234 |
| 4,511,416 | 4/1985 | Karpilloff | 156/233 |

FOREIGN PATENT DOCUMENTS 767714 8/1954 United Kingdom ............... 156/233

Primary Examiner—Michael W. Ball
Assistant Examiner—Louis Falasco
Attorney, Agent, or Firm—McGlew and Tuttle

[57] ABSTRACT

Method of selectively forming an aluminum evaporation film on a surface such as the surface of a container made of plastic film, paper, or glass and of stamping the aluminum evaporation film, by building up the aluminum evaporation film, effecting the stamping work on the aluminum evaporation film or providing the aluminum evaporation film on the surface of a container such as a glass bottle, such as by forming the aluminum evaporation film on one of two films or sheets, applying a hardenable or curable bonding agent meeting or in registry with letters and/or patterns provided on the other of the two films or sheets, then pasting up or joining the two films or sheets together, and thereafter when the bonding agent has hardened, separating the two films or sheets from each other and shifting the aluminum evaporation film to the bonding agent side containing film or sheet.

9 Claims, 6 Drawing Sheets

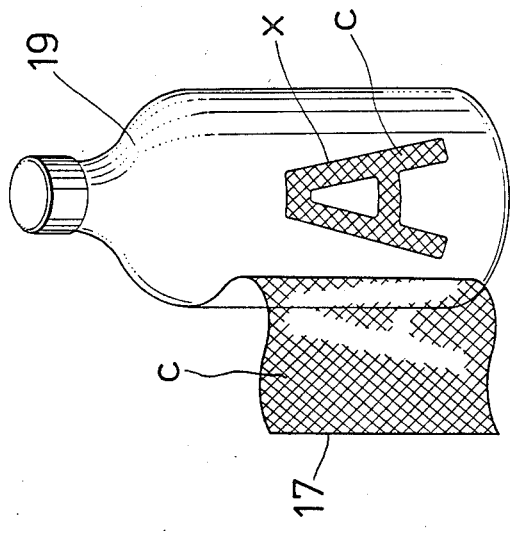
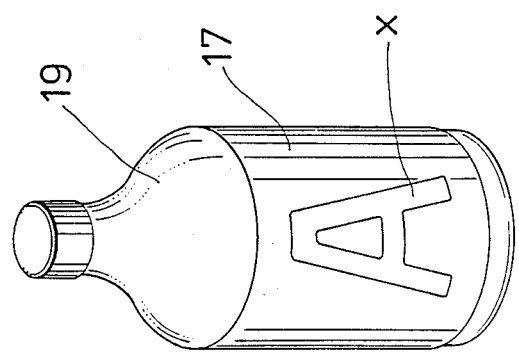

METHOD OF SELECTIVELY FORMING AN ALUMINUM EVAPORATION FACE

This application is a continuation of application Ser. No. 840,587, filed Mar. 18, 1986, now abandoned.

FIELD OF THE INVENTION

This invention relates to a method of enhancing the quality feeling or attributes of commodities by providing letters and various kinds of patterns, using an aluminium evaporation film, onto packaging bags, labels and bottles of refreshing beverages, and the like.

DESCRIPTION OF THE PRIOR ART

As a method of building up an evaporation film of aluminium and zinc onto the surface of plastic film, a vacuum evaporation technique is officially known that heats up and evaporates the aforesaid aluminium or zinc under a high vacuum condition and so as in turn to condense its vapor onto the surface of a plastic film that is placed under the same vacuum condition. The plastic films on which the aluminium evaporation film is formed in this way are those which have excellent gas permeability resistance, an ultraviolet ray shielding property and oil resistivity and which serve to upgrade the quality feeling or attributes of the film, and thus such films are utilized a great deal as packing materials for foodstuffs and confections.

In addition, in regard to a plastic film on which the aforesaid aluminium evaporation film has been formed, a condition in which the film is not covered on its entire surface, namely with the evaporation film being partially omitted from certain areas of the plastic film or a condition in which the plastic film, and thus free from the evaporation film, is partially transparent and visible is sometimes required. This transparent see-through area sometimes stands for the state where the contents inside a bag are simply desired to be made visible or in other cases stands for the letter or pattern itself.

Since the method of forming the aluminium evaporation film on the surface of plastic film is performed under a vacuum condition as earlier mentioned, it is technically impossible to prepare the area where the evaporation film is not constituted or provided on only a part of film in this way.

For this reason, the techniques as shown in FIG. 11 and FIG. 12, or in FIG. 13 and FIG. 14, which as noted herein below are PRIOR ART explanatory views showing, as the case may be, the known stamping process of an aluminum evaporation film, have been adopted traditionally.

According to one or a first such prior art method, as initially shown in FIG. 11 (PRIOR ART) the desired letter or pattern is printed on the surface of a transparent plastic film 01 using the usual ink 02 and the water soluble ink 03, and then the aluminium evaporation film 04 is built up on this printed surface; whereupon it is washed with water for flushing away only the printed face of the water soluble ink 03 area alone as finally shown in FIG. 12 (PRIOR ART), thus providing the transparent area where the aluminium has not been evaporated onto the said washed surface, namely providing the stamping work 05.

However, as the aluminium evaporation surface is directly exposed in the case of the film that is produced as per the aforesaid method, the evaporation film is subject to flaws or friction effects when the film is formed into bags, with undesired resultant break-away or removal of portions of the evaporation film, and further the process is classified into printing, evaporation and water-washing steps which requires the need for winding up the produced products into a roll shape and for transferring the products to the site of the next process step on each of such occasions, thus resulting in the demerits or drawbacks of higher cost and much added effort or trouble.

Also, as another or second such prior art processing method, such a technique is publicly known where, after the letter and pattern are printed on the evaporation surface 06 of transparent plastic film 01 as initially shown in FIG. 13 (PRIOR ART); then the other area than the printed face 07 is subjected to a treatment by acid or alkali solution for providing a stamping process 05 thereon as finally shown in FIG. 14 (PRIOR ART); and further is pasted or joined with a transparent plastic film 08 on this surface as is necessary.

However, even this method involves the same demerits or drawbacks as aforementioned, and a proposal for overcoming such drawbacks by an effective solution is desired.

Secondly, the method of building up the aluminium evaporation film on the surface of paper and not of plastic film is technically infeasible under the aforesaid vacuum condition, and hence, if this formation is necessary, such as technique is adopted where the paper is pasted up or joined to the plastic film to which the aluminium evaporation film has previously been formed.

Even in this last mentioned method, however, such processing techniques as the earlier mentioned water washing and acid washing steps are necessary, resulting in higher cost.

On the other hand, the method of forming the aluminium evaporation film directly on the surface of a bottle of a refreshing beverage or the like is possible by placing the bottle directly under the vacuum condition, but the method of placing the bottle under a vacuum condition in this way is not suitable for a mass production operation and is unprofitable from a cost-wise aspect. For this reason, in practice in the case of such bottles, the actual situation is that the aluminium evaporation film is built up on the surface of the bottle by pasting up or joining to the bottle surface the plastic film on which the aluminium evaporation film has already been formed separately.

SUMMARY OF THE INVENTION

The primary or first objective of this invention is to provide a method of forming an aluminium evaporation film on the surface of a transparent plastic film as well as to provide a stamping process on part of this evaporation surface at a low cost.

The further or second objective of this invention is to build up the aluminium evaporation film directly on the surface of paper at a low cost.

The still further or third objective of this invention is to form the aluminium evaporation film directly on the surface of a glass bottle, plastic container and metallic vessel, as the case may be, at a low cost.

As the means of achieving the aforesaid primary objective, this invention provides such a method wherein the printing is effective as a printed face on one surface of a transparent plastic film using ink, then a transparent or coloured curable or hardenable bonding agent is applied to the said printed face while matching or being in registry with the pattern of the printed face, for pasting it up or joining it with a plastic film on which an aluminium face has been evaporated, and the corresponding pattern area of the aluminium evaporation surface is shifted out of the corresponding evaporation face and onto the bonding agent side for formation of an evaporation film thereon and further for performing the stamping process on part of the evaporation face by separating both of the films from each other when the bonding agent has hardened.

Moreover, as the means of achieving the afore said further or second objective, this invention provides a method of forming the aluminium evaporation face on the surface of a paper sheet by stamping the letter and pattern arrangement desired on the surface of the paper sheet or coating the bonding agent in the form of such letter and pattern arrangement, by pasting up or joining this paper sheet with the aluminium-evaporated plastic film and by shifting to the bonding agent side the area of the letter and pattern arrangement out of the aluminium evaporation face, or the counterpart area other than the letter and pattern arrangement being stamped, by peeling off the two films or sheets from each other when the bonding agent has hardened.

Moreover, as the means of attaining the afore said still further or third objective, this invention provides a method of building up the aluminium evaporation face onto the surface of a glass container and the like, by first pasting up or joining a film X on which the aluminium evaporation film has been formed with the bonding agent-painted or coated film Y after stamping the bonding agent thereon in the area corresponding to the letter and pattern arrangement, such that the face area corresponding to the letter and pattern arrangement on the aluminium evaporation face is left remaining on the film X while the other or counterpart area in contact or registry with the bonding agent area is shifted to the film Y side by peeling the two films off or away from each other when the bonding agent has hardened, and then the evaporation face side of the thus peeled away film X is alone pasted up or joined with such a curable or hardenable bonding agent or the like surface-treated glass container for shifting the remaining aluminium evaporation face of the film X side to the surface of the glass container or the like.

BRIEF DESCRIPTION OF THE DRAWINGS

FIG. 9 is a schematic perspective view showing the state where the film with aluminium evaporation film formed thereon is wound around or placed onto a bottle.

FIG. 10 is a schematic perspective view showing the state where the film has been broken away from the bottle.

DETAILED DESCRIPTION

Figure 1:
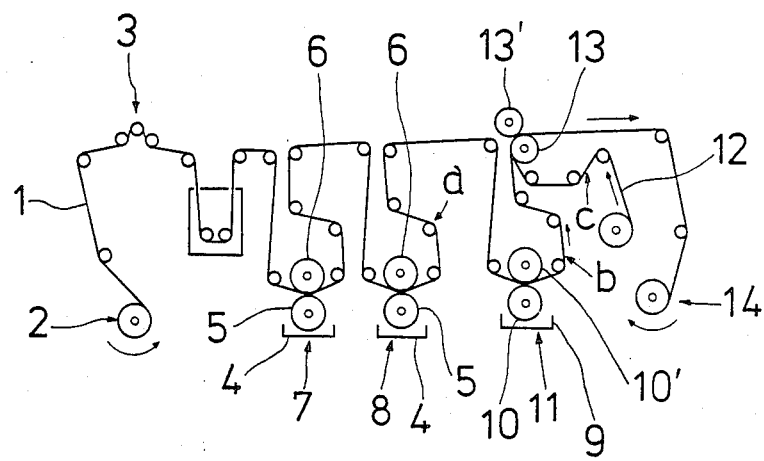
FIG. 1 is a schematic view representing the overall explanatory arrangement for effecting the method according to this invention.

In FIG. 1, the basic embodiment example is shown for not only forming the aluminium evaporation film that has been built up on the surface of the transparent plastic film but also for stamping a part of this evaporation film.

As the transparent plastic film 1 is unrolled from the unwinder 2, and passes through No. 1 and No. 2 printing sections 7 and 8 consisting of ink pan 4, printing plate 5 and pressing plate 6 elements via the tension control group 3, the printing "a" is made on it in a given pattern face.

The plastic film 1 thus printed is then painted or coated with a curable or hardenable bonding agent in "b" a pattern face which is matched to the printed face pattern of the printing "a" when the plastic film 1 passes through the bonding agent coating section 11 that is structured of the transparent bonding agent pan of the urethane system a 9, the press-fitting rolls 10 and 10'. It will be appreciated that tinted bonding agents may also be utilized for this purpose.

On the other hand, the aluminium evaporation film 12 on which the aluminium evaporation face "c" has already been formed as a layer is pasted up or joined with the aforesaid bonding agent face "b" by dint of the rolls 13 and 13', i.e. by mechanical contact roll pressure, such that the face "c" contacts the face "b" at their corresponding coextensive areas of registry, and the resulting two ply film or sheet composite exits from the nip of the rolls 13 and 13', reaches the rewind 14, is wound up by it into a roll shape and is then left there alone until the curing or hardening of the bonding agent "b" is completed.

Figure 2:
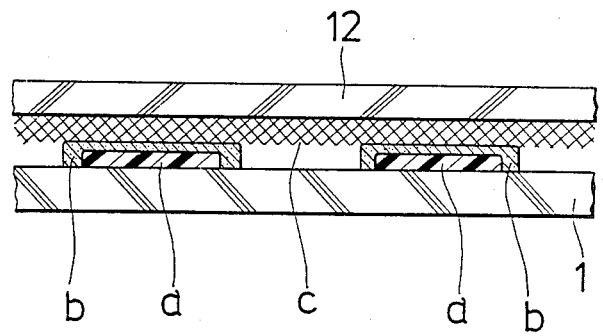
FIG. 2 and FIG. 3 are schematic views representing the explanatory arrangement of the order of performing the stamping process on the aluminium evaporation film face.

FIG. 2 shows the sectional area of this film composite that has been pasted up or joined in this way.

Figure 3:
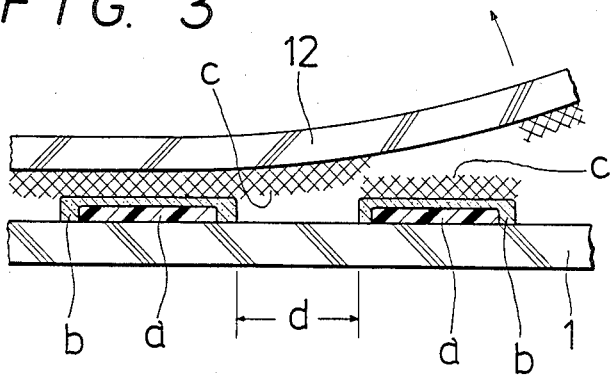

Next, when the curing or hardening of bonding agent "b" is completed, the aluminium evaporation film 12 is peeled off or broken away as illustrated in FIG. 3. When this break-away is carried out, the aluminium evaporation face "c" sticks only to the area of the now cured or hardened bonding agent "b" at the corresponding coextensive contact areas of the printed pattern and the aluminium evaporation face "c" fails to adhere to the remaining reverse image overall area, i.e. corresponding to those individual areas where the bonding agent "b" has not been applied.

As a result, the corresponding area where the bonding agent "b" is applied can be seen through the outer or remote side of the transparent plastic film 1 while the other or remaining area becomes invisible, i.e. is free or blank. In this way, the optional pattern and letter area represented by the counter part area to the basic pattern composed of the original printing "a" thereafter can be stamped.

Moreover, though the aforesaid embodiment example is directed to the stamping process area "d", in terms of the transparent plastic film 1 side of the film composite, nevertheless as seen from the aluminium evaporation film 12 side, the residual aluminium evaporation face, i.e. the portions not in contact with the bounding agent "b", represents the counterpart or reverse image pattern and letter arrangement on this side, so this side can be utilized as a label or packing material after separation of the films 1 and 12 from each other.

After such separation of the two films, the aluminium evaporation face "c" that has been stamped in such a manner, though useable as it is, can be pasted up or joined with a sealant film like polyethylene to cover it if it is to be used, for example, as a packing material.

In addition, as the plastic film 1 in said embodiment example, such films as polyester, acetate, hard quality polyvinyl chloride film, cellophane or heat shrinkable plastic film excellent in transparency and lust are usable. Also, as the aluminium evaporation film 12, such film as polypropylene can be utilized, that has a superb evaporation property for aluminium.

Moreover, in the case of paper or in the case of plastic film otherwise unsuitable for aluminium evaporation, the aluminium evaporation face can be built up or joining by pasting up the aluminium evaporated film 12 in turn to the said type sheet, but it is also possible to form the aluminium evaporation face directly onto these sheets, i.e. via the bonding agent "b" thereon according to this invention, by replacing the plastic film 1 with a paper or the plastic film otherwise unsuitable for the evaporation but containing the printing "a" and bonding agent "b" thereon.

As mentioned above, according to this invention, the stamping process can be carried out by pasting up or joining the aluminium evaporation film with the plastic film or paper on which the bonding agent has been painted in registry with the printed pattern or letter and then by peeling the film 12 and the film 1 or paper sheet away or off from each other when the bonding agent has hardened. As a result of the foregoing, the the following effects are available.

I. The process can be simplified to a series of process steps because the printed and bonding agent-applied film can be produced by the technique of gravure printing to which the aluminium evaporation film can be pasted up or joined, then peeled off after the bonding agent has hardened, which therefore eliminates the need for the usual transporting manipulation or movement and washing processes of film in the stamping process, and serves to reduce the cost that is required for these processes.

II. Since the stamping process can be carried out only by breaking away the sheets that have once been pasted up or joined with each other, the pasting-up or joining and peeling-off processes can be effected automatically by the publicly known means, thus conspicuously speeding up the stamping process.

III. As the stamping process can be achieved by the printing technique, the contours of pattern and letter that are obtained look nicer and further makes available the use of a stamping process of extremely small letter and line that are by far impossible in the conventional washing method because of undesired breaks of the line, as well as the formation of a counterpart aluminium evaporation letter and pattern on the peeled off film 12.

Figure 4:
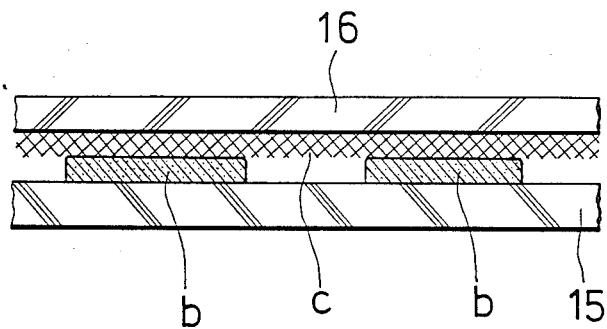
FIG. 4 and FIG. 5 are schematic views representing the explanatory arrangements of the order of forming the aluminium evaporation film onto a paper sheet.
Figure 5:
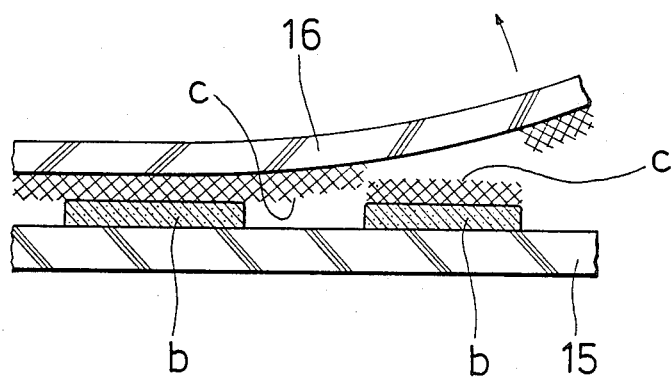

FIGS. 4 and 5 shows the embodiment example of forming the aluminium evaporation film onto the surface of paper in place of the transparent plastic film 1, and as regards the general arrangement of FIG. 1 first of all, the paper 15, being unrolled from the unwinder 2, is given the printing thereon while it passes through the tension control group 3 and further through No. 1 and No. 2 printing sections 7 and 8 each consisting of a ink pan 4, a printing plate 5 and a pressing plate 6.

The paper 15 that has thus been printed will be painted or coated with the letter and pattern (bonding agent "b") when it passes through the bonding agent coating section 11 that is comprised of the transparent bonding agent pan 9 of the urethane system, and the press-fitting rolls 10 and 10'.

On the other hand, the aluminium evaporation film, in this case designated film 16, on which the aluminium evaporation face "c" has been formed, is pasted up or joined to the aforesaid bonding agent face "b" by the pasting-up or joining rolls 13 and is 13', reaches the rewind 14 and wound up thereby into a roll shape, thus being left there alone until the curing, namely, the hardening of bonding agent "b" is completed.

FIG. 4 shows the sectional area of film that has been pasted up joined in this manner.

Next, when the hardening of bonding agent "b" is completed, the aluminium evaporation film 16 is peeled off or broken away as shown in FIG. 5. When the film 16 is peeled off, the aluminium evaporation face "c" sticks only to the area of bonding agent "b", and the aluminium evaporation face "c" fails to adhere to the area where the bonding agent "b" has not been applied.

As a result, the area in paper 15 where the bonding agent "b" has not been painted corresponds to the counterpart area of letter and pattern. Moreover, if the bonding agent "b" is not applied to the area of letter and pattern but is applied to another area, then the counterpart letter and pattern will be stamped.

The aforesaid embodiment example is directed to the side of paper, but as to the side containing aluminium evaporation film 16, the letter and pattern are stamped in counterpart arrangement on the residual aluminium evaporation face on this side. For this reason, this side can also be utilized as a counterpart or reverse image label or packing material.

The paper 15 where the aluminium evaporation face "c" has directly been built up in this way, though useable as it is, can be pasted up joined with such a sealant film as polyethylene film as a protective layer thereon if it is to be used, for example, as a packing material.

It will be appreciated that polypropylene film and the like which are excellent in the evaporation of aluminium can be used as the aluminium evaporation film 16.

Moreover, the paper referred to herein is intended to cover also the concept of a plastic film otherwise unsuitable for direct evaporation thereon in addition to the pulp or paper type sheet.

As mentioned above, this embodiment example has the effect of constituting the aluminium evaporation face directly onto the surface of paper at a low cost by pasting up or joining the aluminium evaporation film with the paper where the bonding agent has been applied in registry with the letter and pattern and by breaking both the sheets away from each other when the bonding agent has hardened.

Also, since the application of the bonding agent is available by using the printing technique, extremely small letter, line and pattern features can be optionally printed, and their finish is very much attractive or beautiful.

FIGS. 6, 7, 8, 9 and 10 show the embodiment examples of forming the aluminium evaporation film onto the surface of a bottle.

Figure 6:
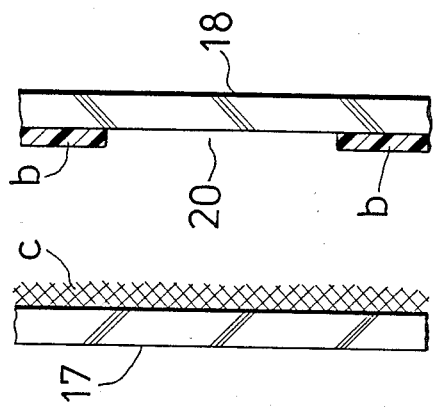
Figure 11:
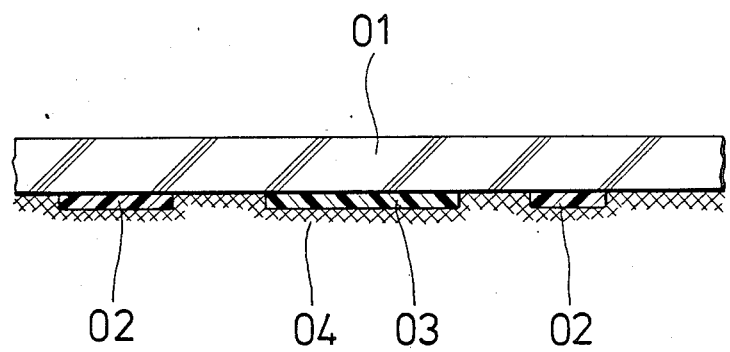
FIG. 11, FIG. 12, FIG. 13 and FIG. 14 are (PRIOR ART) explanatory views showing the publicly known stamping process of an aluminium evaporation film, as earlier described.
Figure 12:
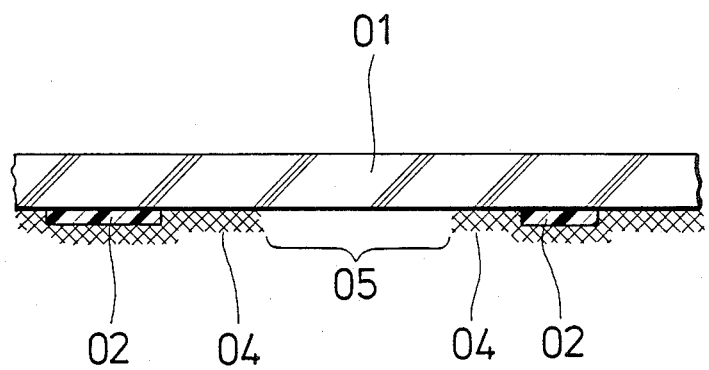
Figure 13:
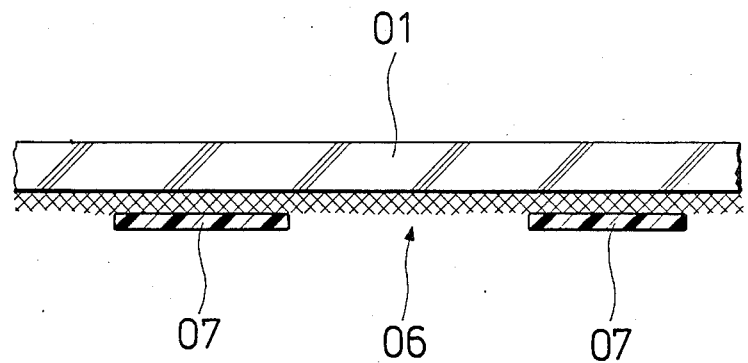
Figure 14:
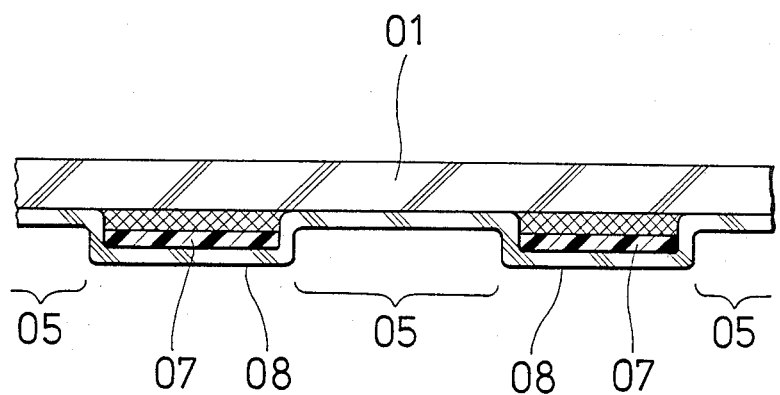

First of all, as illustrated in FIG. 6, this embodiment example builds up the aluminium evaporation face "c", by means of the usual technique, onto the surface of aluminium evaporation acceptable plastic film X, for instance, polypropylene film 17, and applies the urethane system bonding agent "b", on the other hand, onto the surface of another plastic film Y, for example, polypropylene film 18, thus leaving the non-applied area in the form of a Roman style letter "A" in the objective location.

Figure 7:
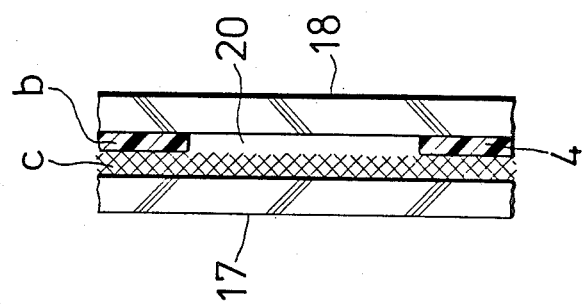

Then, the plastic film Y18 is pasted up or joined with the aforesaid plastic film X17 as shown in FIG. 7, and kept as is until the bonding agent "b" has hardened.

Figure 8:
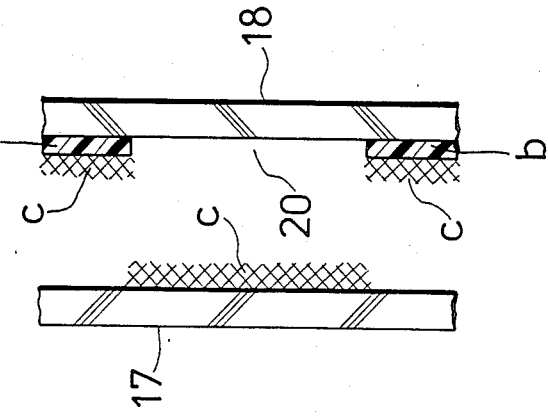
FIG. 6, FIG. 7 and FIG. 8 are schematic views representing the explanatory arrangements of the order of forming the aluminium evaporation film onto a plastic film for the purpose of constituting or providing the aluminium evaporation film onto the bottle.

When the bonding agent "b" has hardened, the plastic film X17 is peeled off from the plastic film Y18 as shown in FIG. 8.

If these films are broken away from each other in this way, the aluminium evaporation face "c" corresponding to the area 20 where bonding agent has not been applied is left on the side of plastic film X17, while the other area shifts to the side of plastic film Y18 because of the sticking or bonding force of the bonding agent.

In this way, the plastic film X17 where the aluminium evaporation face X in the form of the Roman style letter "A" has been formed is directed with its X side of the aluminium evaporation face facing the inside as indicated in FIG. 9, and pasted up or joined to the glass bottle whose surface is painted and treated with the bonding agent "b", then the plastic film X17 is peeled off as shown in FIG. 10 after the bonding agent "b" has hardened. Further, this film need not be broken away, but can be left as it is.

If the plastic film X17 is peeled off in such a way, the aluminium evaporation face X in the form of "A" is left on the surface of glass bottle 19, and becomes the label.

Moreover, a plastic film excellent in transparency can also be bonded to the surface in order to prevent the aluminium evaporation face X from being damaged.

Next, in case of the aforesaid embodiment example as to, the urethane system bonding agent such has previously been applied onto the surface of glass bottle 19, but in place of this sort of bonding agent arrangement, it is also acceptable to coat or apply a resin that softens at low temperature, for instance, a urethane system resin previously on to the surface of glass bottle 19, then to paste up or join the plastic film X17 after heating and softening it, and finally to peel off the plastic film X17 for shifting it to the aluminium evaporation face X after the resin has hardened.

On the other hand, though the aforesaid embodiment example stands for the formation of aluminium evaporation face, on the other hand if the letter and pattern are to be expressed by performing the stamping process onto the aluminium evaporation face, the plastic film Y18 side is pasted up or joined in a similar way while the aluminium face is shifted to the side of glass bottle 19.

This embodiment example, as mentioned above, represents the method of forming the aluminium evaporation face by the plastic film where the aluminium has been evaporated and also by shifting it to the surface of the glass bottle, plastic container, metallic vessel and the like, and serves to build up the aluminium evaporation face onto the surface of the glass bottle and the like, thereby eliminating all the troubles of the water washing or acid washing process, and such that, since the application or pasting-up against, and the peeling-off of the bonding agent away from, the plastic film can be done quite easily, for instance, by the publicly known gravure printing technique, it contributes to the decrease of cost to a vast extent and also to the effect of a great practical use.

As is clear from the aforementioned explanation, according to this invention, the stamping process of letter and pattern can be effected only by pasting up or joining once both the films on the aluminium evaporation film side and the bonding agent applied side and by breaking them away from each other when the bonding agent has hardened. Therefore, the water washing or acid washing that is necessitated in the conventional technique can be eliminated entirely, and its production cost can be reduced to a great extent. Additionally, the aluminium evaporation film can be easily formed on the surface of a bottle and the like.

I claim:

1. Method of shifting an aluminum face area in a selective pattern from an aluminum evaporation face contained on one side of a first sheet to a second sheet containing a curable or hardenable bonding agent in a corresponding such selective pattern on a corresponding side of the second sheet, for forming an aluminum evaporation film in said pattern on the second sheet, comprising the steps of providing one side of such a first sheet with a continuous coating aluminum evaporation face contained thereon, printing one side of such a second sheet with an ink to form a printed ink face in a discrete pattern, applying a curable or hardenable bonding agent onto the printed ink face in matching registry with the printed face discrete pattern, joining the first and second sheets under mechanical pressure to form a sheet composite in which the aluminum evaporation face of the first sheet is in contact with the adjacent bonding agent in such pattern on the second sheet, allowing the bonding agent to cure or harden in the formed sheet composite in discrete areas of curing and hardening, and after the bonding agent has cured or hardened, then transfer the aluminum evaporation face to shift the area of the aluminum evaporation face in contact with the so cured or hardened bonding agent onto the bonding agent, and separating the first and second sheets of the sheet composite from each other, whereby to form simultaneously a corresponding aluminum evaporation film in the selective discrete pattern on the separated second sheet and a reverse image selective discrete pattern area defined by a portion of the aluminum evaporation face which remains on the separated first sheet.

2. Method of claim 1 wherein the first sheet is a plastic film sheet.

3. Method of claim 1 wherein the first sheet is a transparent plastic film sheet.

4. Method of claim 1 wherein the second sheet is a plastic film sheet.

5. Method of claim 1 wherein the second sheet is a paper sheet.

6. Method of claim 1 wherein the bonding agent is a hardenable urethane resin.

7. Method of claim 1 wherein the second sheet is in the form of a container.

8. Method of claim 1 wherein a container having a surface containing a corresponding said reverse image selective pattern area of such a curable or hardenable bonding agent is provided, and the separated first sheet having the reverse image selective pattern area defined by the remainder of the aluminum separation face thereon is joined to the container to form a sheet-container composite in which such remainder of the aluminum evaporation face of the first sheet is in contact with the adjacent bonding agent in such selective pattern area on such surface of the container, and allowing the bonding agent to cure or harden in the sheet-container composite.

9. Method of claim 8 wherein the area of the aluminum evaporation face in contact with the so cured or hardened bonding agent is shifted onto the bonding agent, by thereafter separating the first sheet from such container surface.

* * * * *